INVENTOR.
RONALD ROSENZWEIG
BY
W.S. Hill
AGENT

INVENTOR.
RONALD ROSENZWEIG
BY
W. S. Hill
AGENT

United States Patent Office 3,427,511

Patented Feb. 11, 1969

3,427,511

HIGH FREQUENCY TRANSISTOR STRUCTURE WITH TWO-CONDUCTIVITY EMITTERS

Ronald Rosenzweig, Somerville, N.J., assignor to Radio Corporation of America, a corporation of Delaware Filed Mar. 17, 1965, Ser. No. 440,397

U.S. Cl. 317—235 9 Claims

Int. Cl. H01l 11/00

ABSTRACT OF THE DISCLOSURE

A transistor having a particular emitter construction to inhibit "second breakdown" thus permitting safer operation at high voltages, comprising a central high resistance emitter portion concentric with a surrounding active emitting portion with the emitter connection being made only to the high resistance portion such that there is substantially equal electrical resistance between the connection and all points on the active periphery.

This invention relates to improved semiconductor devices and particularly, but not necessarily exclusively, to improved transistors capable of handling high power at high frequencies.

Although transistors are known which are capable of handling relatively high power (more than 1 watt) at relatively high frequencies (more than 100 megacycles) such transistors have generally been limited in their operating characteristics by an undesirable phenomenon known as second breakdown. Second breakdown has been defined as a phenomenon in which the emitter current of a transistor concentrates in local regions and locally overheats the transistor, often causing serious impairment of operation or complete destruction. When second breakdown occurs, the output impedance of a transistor changes almost instantaneously from a large value to a small limiting value. It may be distinguished from normal transistor operation by the fact that once it occurs, the base no longer controls normal collector characteristics. Second breakdown is associated with imperfections in the device structure, usually being more severe in multiple-diffused, high-power devices.

Considerable improvement in operating characteristics of high power, high frequency transistors has been achieved (1) by increasing the ratio of emitter periphery to emitter area, and (2) by spreading and/or dividing the emitter region in order to improve the internal heat dissipating ability of the device. However, still further improvement in power handling capabilities at high frequencies is desirable.

One object of this invention is to provide an improved semiconductor device having improved second breakdown characteristics.

Another object is to provide semiconductor devices with improved power handling capabilities at relatively high frequencies.

A further object is to provide an improved transistor with good stability of operation.

A further object of the invention is to provide transistors having increased stability at high temperatures.

One feature of the invention comprises a device which includes a semiconductor body having a diffused base region which is concentric with an emitter region and wherein the emitter is composed of two portions, a diffused portion, which is the active emitter portion, adjacent the base region, and a ballast resistor portion of relatively high resistivity. Contact is made to the highly resistive portion such that current flows between the contact means and the active portion in a diffused spreading manner with the resistor presenting substantially equal resistance to current flow between the contact and the active emitter portion.

In a preferred embodiment, the emitter includes a central diffused portion of relatively high sheet resistance to the center of which the emitter lead is attached. Surrounding this portion of high sheet resistance is an annular portion of relatively high conductivity which constitutes the active emitting portion. The highly resistive central portion acts as a ballast resistor in series with the actively emitting portion to prevent high current concentrations. The ballast resistor has been designed to utilize the spreading resistance from the center of a circle to its circumference.

Another feature of the invention comprises an improved base region contact disposition with respect to the emitter. The base contacts are so disposed that the entire emitting surfaces of the emitter regions are at substantially equal potential with respect to the base contacts.

A more detailed description of the features of the invention, together with illustrative embodiments thereof, are described below in conjunction with the drawings, in which—

In the various figures, similar parts are designated with the same characters.

Figure 1:
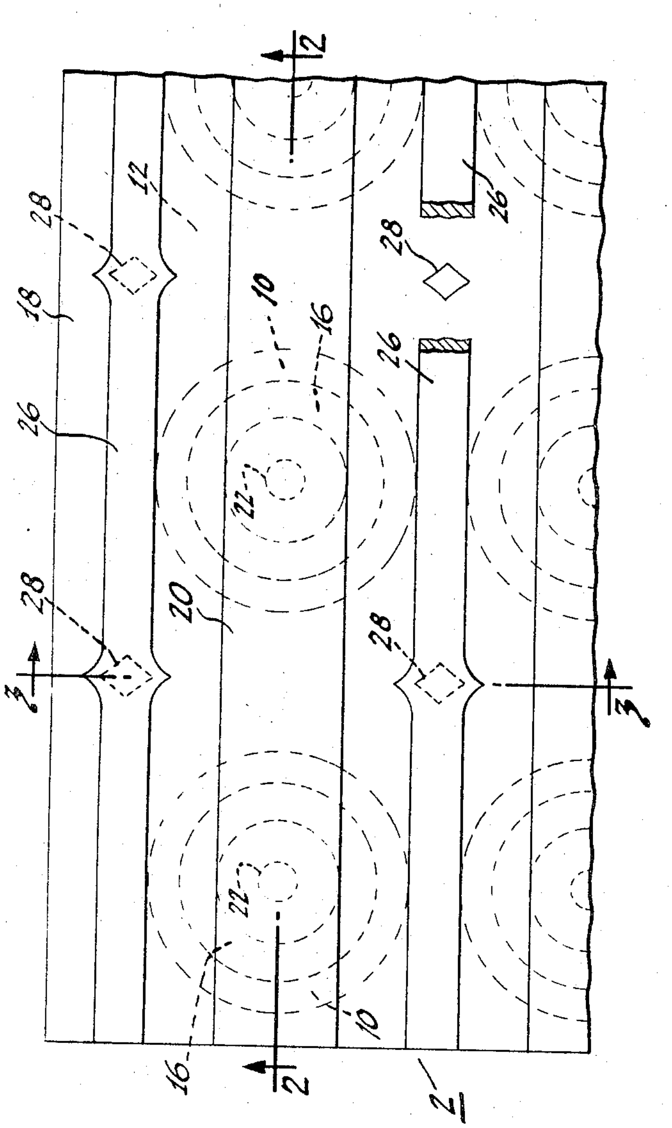
FIGURE 1 is a plan view, partly broken away, of part of a device constructed in accordance with the present invention.
Figure 2:
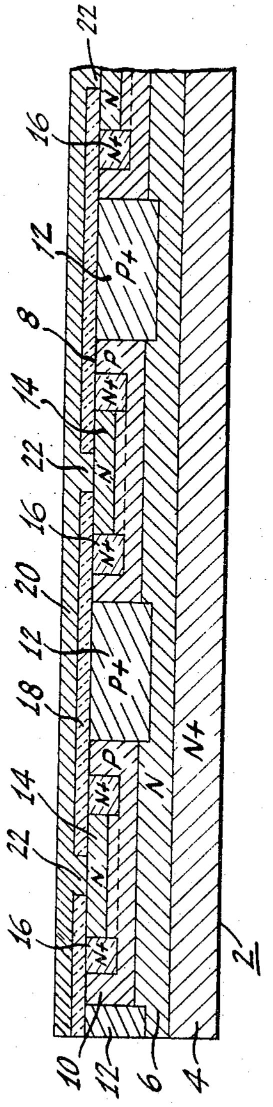
FIGURE 2 is a sectional view taken along the line 2—2 of FIGURE 1.
Figure 3:
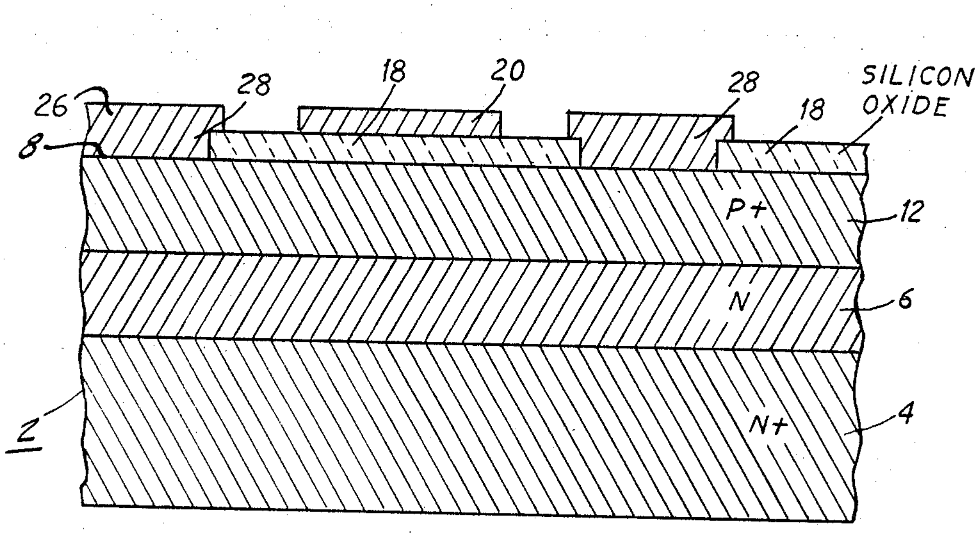
FIGURE 3 is a sectional view, considerably enlarged, taken along the line 3—3 of FIGURE 1.

FIGURES 1 to 4 illustrate an embodiment of a transistor constructed in accordance with the invention. Illustrated in FIGURES 1 and 2 is a small part of a planar type power transistor shown more in its entirety in FIGURE 4. The device comprises a body of semiconducting single crystal silicon 2 having a collector region 4 of N+ conductivity type silicon which may have a resistivity of about 0.01 ohm cm. Superimposed on the region 4 is an epitaxial layer 6 of N type silicon and having a resistivity of about 2 to 3 ohm cm. The thickness of the region 4 may be about 6 to 8 mils, for example, and the epitaxial layer 6 may, for example, be 0.8 mil in thickness. Adjacent the upper surface 8 of the silicon body is a multiplicity of discrete circular-shaped diffused base region portions 10 which are of P type conductivity. The base region portions 10 may each have a thickness of about 0.08 to 0.1 mil. The surface or sheet resistance of these portions may be about 150 ohms per square. They may be made by diffusing boron trioxide or boron tribromide into the body from the upper surface 8 at a temperature of 890° to 920° C. for 30 minutes, then at 1200° C. for an additional 30 minutes. These discrete base region portions constitute only part of the entire base region of the device.

The base region also includes a portion or zone 12 of P+ conductivity type surrounding the circular portions 10 and occupying the entire upper layer of the body outside of the circular portions 10. This P+ zone 12 has a sheet resistance of about 1 ohm per square. It may be made by diffusing in boron either in the form of boron trioxide or boron tribromide, for example, at 1150° C. for 15 minutes. Base contact is made to parts of the zone 12.

Also extending in from the upper surface 8 of the semiconductor body, each base region portion 10 has associated with it an emitter resistor region 14 about 0.03 to 0.04 mil in depth. These regions are designed to have a sheet resistance of about 2 or 3 to 100 ohms per square. They may be made by diffusing, for example, phosphorus oxychloride ($POCl_3$) at 900° C. for 35 minutes. In the device illustrated, the regions 14 are 1.5 mils in diameter.

Also associated with each base region portion 10 and each emitter resistor region 14 is an annular-shaped emitter portion 16 composed of N+ conductivity material. These portions 16 constitute the active emitting regions of the device. In the device illustrated, the portions 16 have an outer diameter of 2.5 mils and are diffused in to a depth of 0.05 to 0.06 mil. Thus they extend somewhat deeper and are doped heavier than their associated resistor portions 14. The portions 16 may be made by diffusing phosphorus oxychloride into the upper surface of the body at 1025° C. for 16 minutes.

Figure 4:
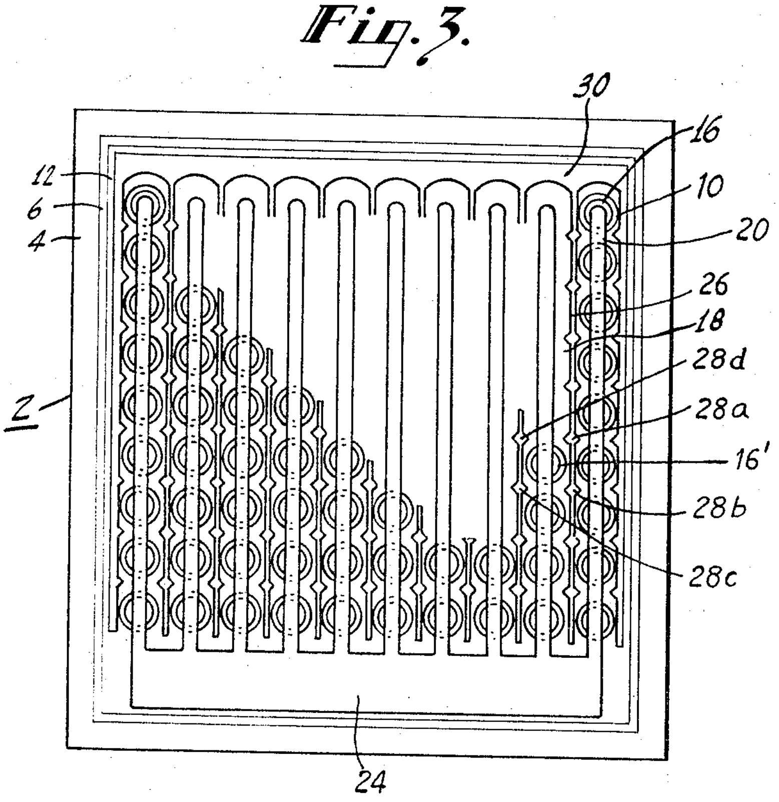
FIGURE 4 is a plan view of a high power transistor which includes features of the invention.

Covering the entire upper surface 8 except for openings for contacts to the emitters and base is an insulating film of silicon dioxide 18. Metallic emitter contacts 20 in the form of strips of metal, such as aluminum, are deposited by vacuum evaporation over the silicon oxide layer and make contact through the oxide layer to the center of each emitter resistor portion 14 at small circular regions 22. As shown in FIGURE 4, these strips are joined at one end to form a comb-like structure 24 in the complete power transistor.

A further feature of the invention relates to the base contacts of the device. Base contacts of the device are made, e.g., by vacuum evaporating and depositing aluminum strips 26 over the silicon dioxide layer 18 and making contact through the silicon oxide layer to the P+ part of the base region 12 through regularly spaced openings 28 shown in detail in FIGURE 3. In the device illustrated, the openings 28 are 1 square mil in area pillow-shaped figures with concave edges. These contacts are disposed so that their concave edges are symmetrical with respect to the circular peripheries of the N+ emitter regions 16. The edges of the openings 28 are arcs of circles having the same centers as the circular peripheries of the regions 16 closest to them. As illustrated in FIGURE 4, taking any one emitter site, for example 16', the four base contacts **28*a*, 28*b*, 28*c*, and 28*d* are symmetrically disposed such that all parts of the emitter periphery are at substantially equal potential with respect to the base contacts. This arrangement tends to provide substantially equal distribution of emitter-base current at each emitter site and is a further aid in inhibiting second breakdown. As shown in FIGURE 4, the base contact strips are all connected together at one end to form a comb-like structure 30**.

The sheet resistance of the ballast resistors 14 in the device shown can be varied from 2 to 100 ohms per square, for example, to obtain desired variability in resistance. In addition to the sheet resistance of the material, the resistance in each resistor is governed by the logarithmic ratio of the outer diameter of the resistor 14 to its inner diameter around the contact areas. In the device illustrated, a preferable logarithmic ratio of outer diameter to inner diameter is 5. It is intended that the resistor portions 14 not act as current emitters since this would reduce their effectiveness. In the device which has been described above, the annular emitter rings 16, extending deeper into the base region than the resistors 14, inhibit injection from the resistors by separating the resistors from the base region 10. For base current to reach the resistors 14 and to supply emitter deficiency current, it would have to pass through the high sheet resistance base region portion under the heavily-doped emitter rings. Good resistance to second breakdown can be obtained, however, even when the high resistance portions 14 and the active portions 16 are diffused in to the same depth since emission of emitter-to-base current occurs almost entirely at the edges of the emitter in the device configuration shown. The embodiment illustrated is a preferred form.

The effect of the ballast resistor 14 is to decrease the emitter-to-base voltage when the current increases excessively at any one site.

Transistors have been fabricated with a ballast resistance of up to 25 ohms per emitter site. These transistors have shown a continuous improvement in second breakdown as the ballast resistance was increased. Transistors that normally could tolerate not more than 35 volts at one ampere can tolerate over 100 volts with these resistors.

Transistors similar to the device illustrated in FIGURE 4, but having double the number of emitter sites and double the surface area shown, have been tested for Class C amplifier performance. At 50 mc. the performance was equivalent to non-ballasted transistors delivering 65 watts with 5 watts drive at 28 volts. Thus the great improvement in second breakdown resistance has been achieved with no sacrifice in performance at this frequency. Because of the large number of emitter sites connected in parallel, the total resistance of the device is very low. In a typical transistor which was constructed with 180 emitter sites, each site had about 18 ohms resistance and the total resistance was therefore only about 0.1 ohm.

Although, in the embodiment illustrated, the active emitter portions and the ballast resistor portions have been shown as circular in shape, they could both take other shapes, such as elongated rectangles, for example. It is intended here that the word "concentric" shall apply to any form in which both portions of the emitter have a common center.

Although the invention has been illustrated as it applies to a high power transistor with a multiplicity of emitter sites, it also applies to a transistor having a single emitter and a single base region. However, it is in the high frequency high power handling type device that the need for inhibiting second breakdown is most pronounced.

What is claimed is:

1. In a transistor of the junction type wherein an emitter region of one conductivity type is surrounded by a base region of opposite conductivity type, the improvement comprising said emitter region being composed only of inner and outer concentric portions, said inner portion being of substantially higher resistivity than said outer portion, and means for making emitter lead contact only to said inner portion.

2. In a transistor of the junction type having a base portion region concentric with an emitter region, the improvement wherein said emitter region is composed of two concentric portions, one of said portions being of relatively high resistivity material and the other of said portions being of relatively low resistivity material, said portion of low resistivity constituting the actively emitting portion of the device, and means for making emitter lead contact only to said high resistivity portion.

3. In a transistor of the junction type wherein an emitter region of one conductivity type is surrounded by a base region opposite conductivity type, the improvement comprising said emitter region having only inner and outer circular concentric portions, said inner portion being of substantially higher resistivity than said outer portion, and means for making emitter lead contact only to the center of said inner portion.

4. A transistor of the junction type including a multiplicity of discrete emitter regions each of which is composed of two concentric portions, one of said portions being of relatively high resistivity material and the other of said portions being of relatively low resistivity material, said portions of low resistivity constituting the actively emitting portions of the emitters, and means for connecting in parallel said emitter regions only at the centers of said high resistivity. portions.

5. A transistor of the junction type having a base region surrounding a multiplicity of discrete emitter regions, each emitter region being composed of two concentric portions, one of said portions being of relatively high resistivity material and the other of said portions being of relatively low resistivity material, said portions of low resistivity constituting the actively emitting portions of the device, and means for making emitter lead connections only to the centers of said high resistivity portions.

6. A transistor of the planar, junction type including a multiplicity of discrete emitter regions each of which is composed of two concentric portions, one of said portions being of relatively high resistivity material and the other of said portions being of relatively low resistivity material, said portions of low resistivity constituting the actively emitting portions of the emitters, an insulating coating covering said emitter regions, and means for connecting in parallel said emitter regions only at the centers of said high resistivity portions, said means comprising strips of metal evaporated upon said coating and metal leads extending from said strips to said centers through openings in said coating.

7. A transistor of the junction type comprising a base region, an emitter region surrounded by said base region and having an active emitting periphery of relatively low resistivity adjacent said base region, a ballast resistor region embedded in said emitter region, and an emitter lead connected to said resistor such that the resistance between said lead and all parts of sai dperiphery is substantially equal.

8. A transistor comprising a body of semiconductor material having a surface adapted for making electrode connections, a base region of one conductivity type within said body, an annular shaped emitter region of opposite conductivity type extending into said body from said surface to a predetermined depth, an emitter resistor region within and concentric with said emitter region, said resistor region extending into said body from said surface to a depth less than that of said emitter region, and emitter electrode connection means attached to said resistor region at said surface.

9. In a transistor of the junction type wherein an emitter region of one conductivity type is concentric with a base region portion of opposite conductivity type, the improvement comprising said emitter region being composed only of first and second concentric portions, said first portion being of substantially higher resistivity than said second portion, said second portion being adjacent to said base region, portion and means for making emitter lead contact only to said first portion.

References Cited

UNITED STATES PATENTS

| | | | |
|---|---|---|---|
| 2,980,830 | 4/1961 | Shockley | 317—235 |
| 3,180,766 | 4/1965 | Williams | 148—33 |
| 3,225,261 | 12/1965 | Wolf | 317—101 |

JOHN W. HUCKERT, *Primary Examiner.*

R. SANDLER, *Assistant Examiner.*